United States Patent
Kamigaki et al.

(10) Patent No.: US 7,604,926 B2
(45) Date of Patent: Oct. 20, 2009

(54) METHOD OF MANUFACTURING A SEMICONDUCTOR DEVICE

(75) Inventors: Tetsuya Kamigaki, Yokohama (JP); Eiji Ito, Kawasaki (JP); Koji Hashimoto, Yokohama (JP); Hideyuki Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 609 days.

(21) Appl. No.: 11/346,237

(22) Filed: Feb. 3, 2006

(65) Prior Publication Data
US 2006/0234165 A1 Oct. 19, 2006

(30) Foreign Application Priority Data
Apr. 18, 2005 (JP) .............................. 2005-119864

(51) Int. Cl.
*G03F 7/26* (2006.01)
(52) U.S. Cl. ...................... 430/311; 430/313; 430/394; 430/323; 430/324; 430/316
(58) Field of Classification Search ................ 430/316, 430/322, 323, 324, 314, 313
See application file for complete search history.

(56) References Cited

U.S. PATENT DOCUMENTS

| 5,328,810 | A | * | 7/1994 | Lowrey et al. ............... 430/313 |
| 6,063,688 | A | | 5/2000 | Doyle et al. |
| 6,475,891 | B2 | | 11/2002 | Moon |
| 6,475,892 | B1 | | 11/2002 | Bhakta |
| 2004/0165443 | A1 | | 8/2004 | Harari |

* cited by examiner

*Primary Examiner*—Mark F Huff
*Assistant Examiner*—Caleen O Sullivan
(74) *Attorney, Agent, or Firm*—Finnegan, Henderson, Farabow, Garrett & Dunner, L.L.P.

(57) ABSTRACT

A method of manufacturing a semiconductor device, comprises forming a first mask pattern on an under-layer region, forming a plurality of dummy-line patterns on the under-layer region, the dummy-line patterns being arranged at a first pitch, forming second mask patterns having mask parts provided on long sides of the dummy-line patterns, removing the dummy-line patterns, and etching the under-layer region by using the first mask pattern and the mask parts as a mask.

19 Claims, 5 Drawing Sheets

METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2005-119864, filed Apr. 18, 2005, the entire contents of which are incorporated herein by reference.

BACKGROUND OF THE INVENTION

1. Field of the Invention

The present invention relates to a method of manufacturing a semiconductor device.

2. Description of the Related Art

Miniaturization of semiconductor devices greatly depends on the photolithography employed to manufacture the devices. Therefore, it is generally difficult to form line-and-space patterns that have widths smaller than the minimum width attained by the resolution limit of photolithography.

To solve this problem, a method has been proposed. In this method, a sidewall pattern is formed on the sidewall of a dummy pattern and is used as mask to perform etching. (See, for example, U.S. Pat. No. 6,063,688.) This method can indeed provide a line-and-space pattern in which the lines are formed at half the line pitch of the dummy pattern.

However, this method is not designed for patterns other than line-and-space patterns. Inevitably, it cannot form a pattern including line-and-space pattern and patterns of other types, reliably or efficiently.

Thus, it has been difficult to form patterns reliably and efficiently, rendering it difficult to manufacture excellent semiconductor devices.

BRIEF SUMMARY OF THE INVENTION

According to a first aspect of the invention, there is provided a method of manufacturing a semiconductor device, comprises: forming a first mask pattern on an under-layer region; forming a plurality of dummy-line patterns on the under-layer region, the dummy-line patterns being arranged at a first pitch; forming second mask patterns having mask parts provided on long sides of the dummy-line patterns; removing the dummy-line patterns; and etching the under-layer region by using the first mask pattern and the mask parts as a mask.

According to a second aspect of this invention, there is provided a method of manufacturing a semiconductor device, comprising: forming a plurality of dummy-line patterns on an under-layer region, the dummy-line patterns being arranged at a first pitch; forming mask patterns having mask parts provided on long sides of the dummy-line patterns, each of the mask patterns being shaped like a closed loop and surrounding each of the dummy-line patterns; removing the dummy-line patterns; removing both end parts of each of the mask patterns to leave the mask parts; and etching the under-layer region by using the mask parts as a mask.

DETAILED DESCRIPTION OF THE INVENTION

An embodiment of the present invention will be described, with reference to the accompanying drawings. The embodiment is a method of manufacturing a NAND-type flash memory (i.e., a nonvolatile semiconductor memory).

Figure 1:
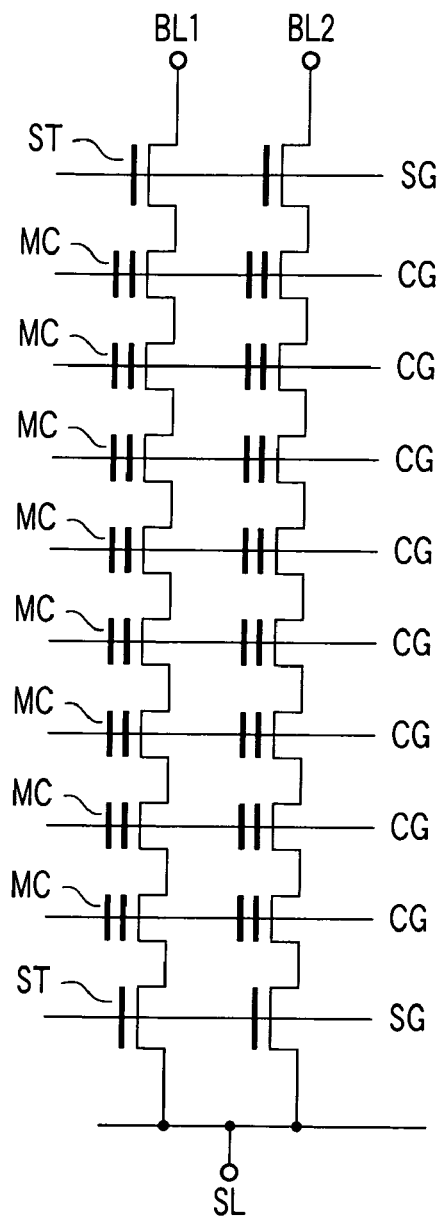
FIG. 1 is an equivalent-circuit diagram of a NAND-type flash memory manufactured by a method according to an embodiment of this invention.

FIG. 1 is an equivalent-circuit diagram of the NAND-type flash memory. The flash memory has NAND-cell units. Each NAND-cell unit comprises two select transistors ST and a plurality of memory cells MC. The memory cells MC are connected in series between the select transistors ST. Two select gate lines SG are connected to the select transistors ST, respectively. Control-gate lines (i.e., word lines) CG are connected to the memory cells MC, respectively. A bit line (BL1, BL2, . . . ) is connected to one of the select transistors ST. A source line SL is connected to the other select transistor ST. As FIG. 1 shows, each NAND cell unit has eight memory cells MC. Nonetheless, the number of memory cells that each cell unit has is not limited to eight.

The method of manufacturing a NAND-type flash memory, which is an embodiment of this invention, will be described.

Figure 2:
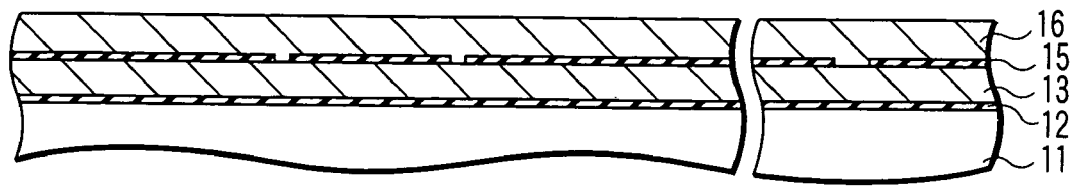
FIGS. 2 to 11 are sectional views showing steps of the method of manufacturing a nonvolatile semiconductor memory device according to an embodiment of this invention.
Figure 3:
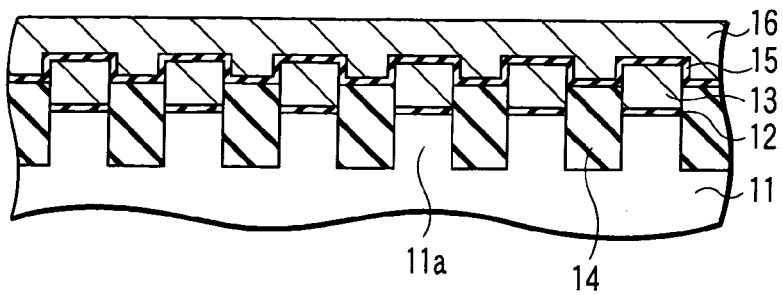

At first, such a structure as shown in FIGS. 2 and 3 is formed. FIG. 2 is a sectional view taken along the direction in which bit lines extend (hereinafter referred to as "bit-line direction"). FIG. 3 is a sectional view taken along the direction in which word lines extend (hereinafter referred to as "word-line direction"). How this structure is formed will be briefly explained.

First, a tunnel-insulating film 12 is formed on a semiconductor substrate (e.g., silicon substrate) 11. A floating-gate electrode film 13 is formed on the tunnel-insulating film 12. The semiconductor substrate 11, tunnel-insulating film 12 and floating-gate electrode film 13 are patterned, forming a plurality of element regions 11a and a plurality of isolation trenches, which extend in a bit-line direction. The isolation trenches are filled with insulating material, forming isolation regions 14. Subsequently, inter-electrode insulating film 15 is formed, and a control-gate electrode film 16 is formed on the inter-electrode insulating film 15. As a result, an under-layer region of the type shown in FIGS. 2 and 3 is obtained.

Figure 4:
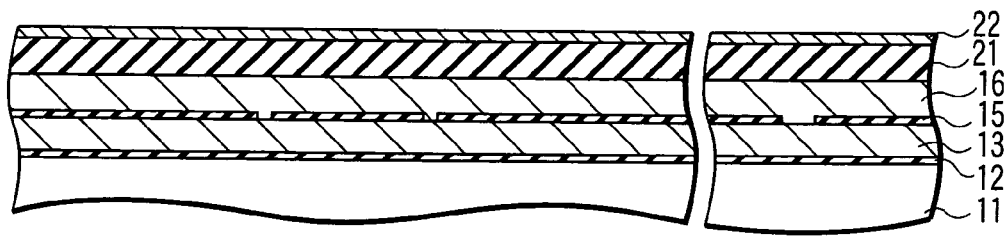

As shown in FIG. 4 (a sectional view taken along the bit-line direction), a mask film 21 made of BSG or the like is formed on the under-layer region. A hard mask film 22 made of amorphous silicon or the like is formed on the mask film 21.

Figure 5:
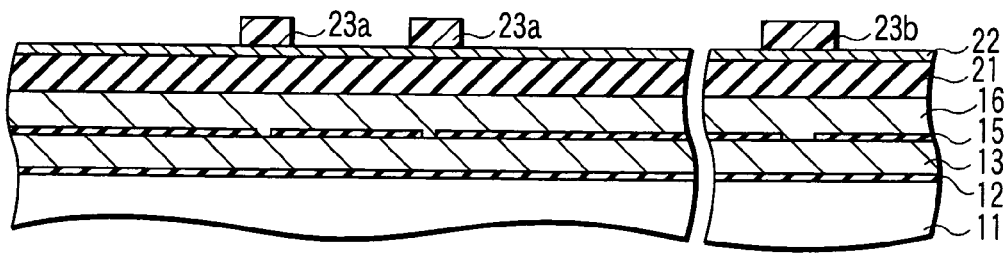

As FIG. 5 depicts, photoresist patterns 23a and 23b are formed on the hard mask film 22 by ordinary photolithography, in order to form patterns in a non-word-line formation region in which no word lines will be formed. The photoresist pattern 23a is used to form a select-gate line pattern. The photoresist pattern 23b is used to form a peripheral-circuit pattern (e.g., gate pattern for the transistors of a peripheral circuit).

Figure 6:
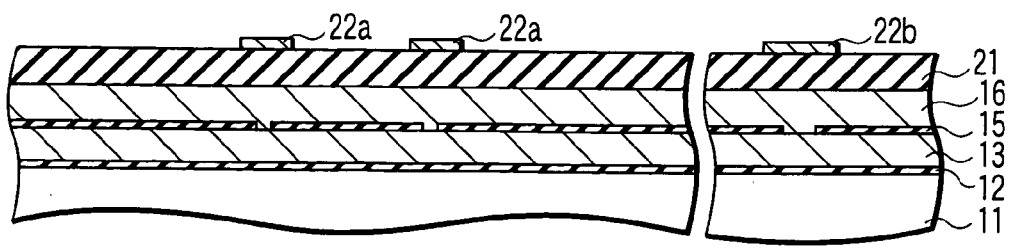

As FIG. 6 shows, the hard mask film 22 is patterned by means of reactive ion etching (RIE), by using the photoresist patterns 23a and 23b as mask. Hard mask patterns (protective mask patterns) 22a and 23b are thereby formed. Then, the photoresist patterns 23a and 23b are removed.

Figure 7:
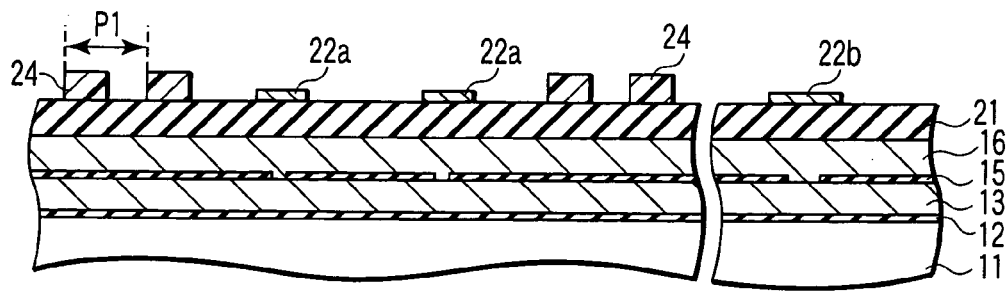

Next, ordinary photolithography is carried out, forming a plurality of photoresist patterns (provisional patterns) 24 on the mask film 21 as is illustrated in FIG. 7, in order to provide a line-and-space pattern in a word-line forming region. The photoresist patterns 24 are arranged at a pitch P1 (first pitch) in a bit-line direction.

Figure 8:
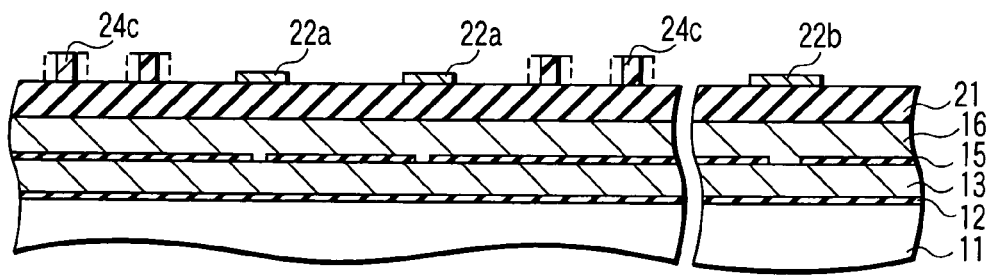

As FIG. 8 shows, an ordinary slimming technique is applied, making the photoresist patterns 24 slim. Photoresist patterns 24c narrower than the patterns 24 are thereby formed. Thus, the slimming technique provides photoresist patterns 24c having a width smaller than the minimum width attained by the resolution limit of photolithography, though the width of the photoresist patterns 24 are greater than the said minimum width.

Figure 9:
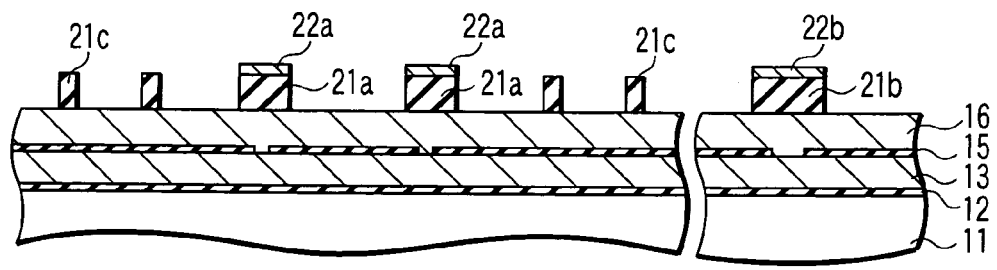

As FIG. 9 depicts, the mask film 21 is patterned by RIE using the hard mask patterns 22a and 22b and photoresist patterns 24c as mask. As a result, mask patterns (first mask patterns) 21a and 21b are formed in the non-word-line forming region, and dummy-line patterns 21c are formed in the word-line forming region.

As indicated above, the photoresist patterns 24 are slimmed. Instead, the mask film 21 may be directly slimmed. If the mask film 21 is formed of BSG, the mask film 21 may be subjected to low-power RIE, using the photoresist patterns 24 as mask. Thus, the mask film 21 can be directly slimmed.

Figure 10:
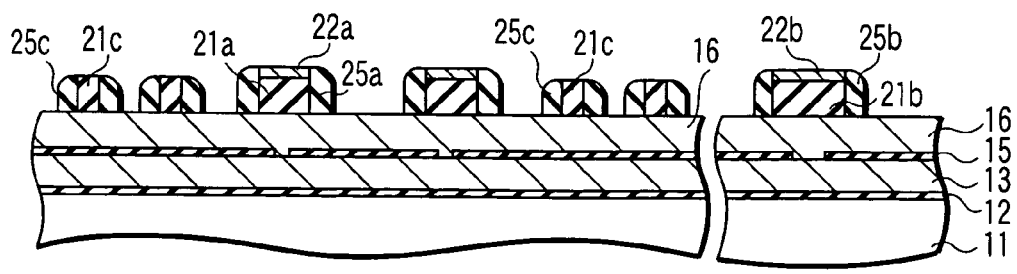

As FIG. 10 shows, a silicon nitride film is formed on the entire surface of the resultant structure by means of CVD. The silicon nitride film covers the mask patterns 21a and 21b, dummy-line pattern 21c and hard mask patterns 22a and 22b. Anisotropic etching (e.g., RIE) is performed on the silicon nitride film. As a result, sidewall mask patterns 25c (second mask patterns) are formed on the sides of the dummy-line pattern 21c. Sidewall mask patterns (third mask patterns) 25a and 25b are formed on the sides of the mask patterns 21a and 21b.

Figure 11:
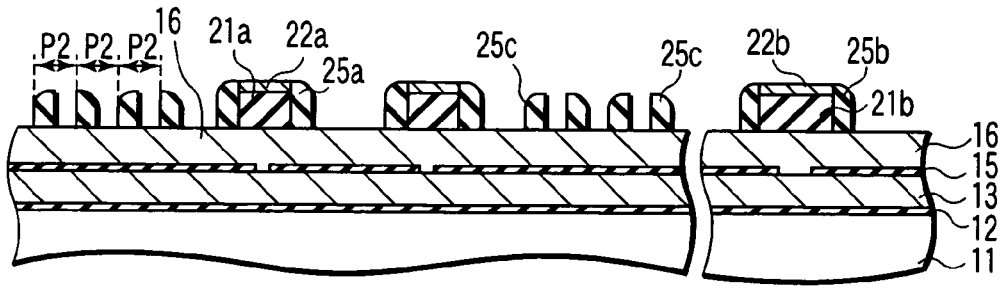

Then, hydrofluoric acid (HF)-based wet-etching liquid is applied, removing the dummy-line pattern 21c as is illustrated in FIG. 11. At this time, the hard mask patterns 22a and 22b cover the upper surfaces of the mask patterns 21a and 21b. Hence, neither the mask pattern 21a nor the mask pattern 21b is removed.

The sidewall mask patterns 25c thus formed are arranged at a pitch P2 (second pitch) in the bit-line direction. Pitch P2 is half the pitch P1 at which the photoresist patterns 24 are arranged. In other words, it is half the pitch P1 of the dummy-line pattern 21c. The sidewall mask patterns 25c can be spaced apart by the same distance by adjusting the width of the dummy-line pattern 21c and the width (thickness) of the sidewall mask patterns 25c. Thus, the sidewall mask patterns 25c can be equidistantly spaced, namely at pitch P2. Since the sidewall mask patterns 25c are formed without performing photolithography, they can be formed at a pitch shorter than the pitch determined by the resolution limit of photolithography.

It should be noted that each sidewall mask pattern 25c covers all sides of a dummy-line pattern 21c in the step of FIG. 10. Namely, a closed loop surrounds the dummy-line pattern 21c. If the sidewall mask patterns 25c shaped like a closed loop are used as mask in the process of etching the under-layer region, an under-layer pattern shaped like a closed loop will be formed. The under-layer pattern so shaped may be used to provide wires such as word lines. In this case, adjacent wires will not be separated, preventing the device from operating as is desired.

Figure 12:
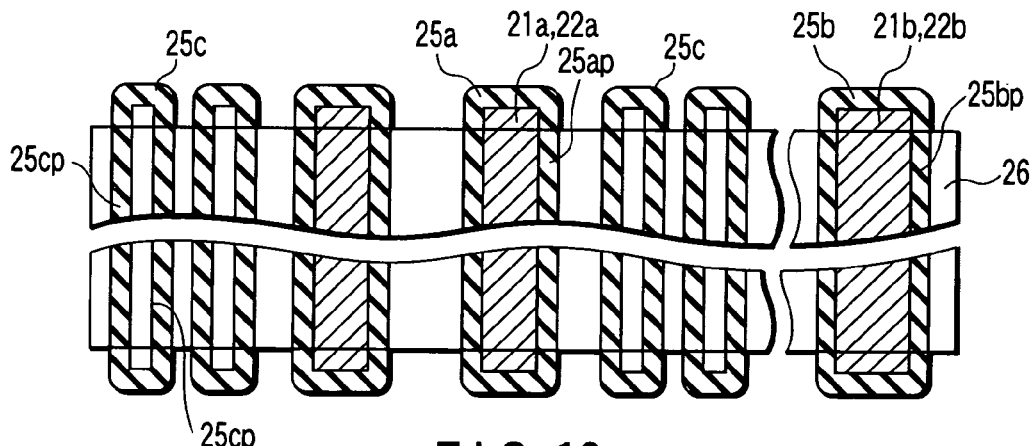
FIGS. 12 and 13 are plan views showing steps of the method of manufacturing the nonvolatile semiconductor memory device according to the embodiment of this invention.

To make the device operate as is desired, a photoresist pattern 26 is formed by ordinary photolithography, as is illustrated in FIG. 12 (plan view). The photoresist pattern 26 covers those mask parts 25cp of each sidewall mask pattern 25c, which are formed on the longer sides of the dummy-line pattern 21c (i.e., the sides extending in the lengthwise direction of the dummy-line pattern 21c). The photoresist pattern 26 covers, the mask parts 25ap of the sidewall mask pattern 25a and the mask parts 25bp of the sidewall mask pattern 25b, in the same manner as the sidewall mask pattern 25c. Note that the sidewall mask patterns 25a and 25b are provided in the non-word-line forming region.

Figure 13:
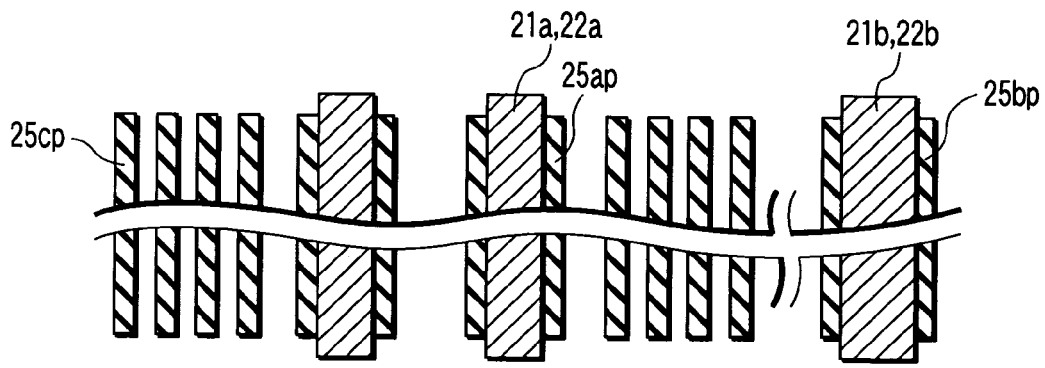

As FIG. 13 shows, the sidewall mask patterns 25a, 25b and 25c are etched by using the photoresist pattern 26 as mask. Both end parts of the sidewall mask pattern 25c are thereby removed, and the mask parts 25cp remain intact. Similarly, the mask parts 25ap and 25bp of the sidewall mask patterns 25a and 25b, both provided in the non-word-line forming region, remain intact. Thereafter, the photoresist pattern 26 is removed.

Figure 14:
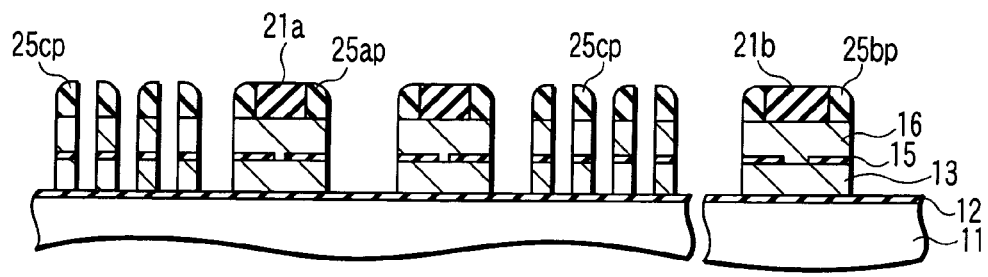
FIGS. 14 and 15 are sectional views showing steps of the method of manufacturing the nonvolatile semiconductor memory device according to the embodiment of this invention.

As is shown in FIG. 14 (sectional view), etching is performed on the under-layer region after the hard mask patterns 22a and 22b are removed. That is, the control-gate electrode film 16, inter-electrode insulating film 15 and floating-gate electrode film 13 are etched in the word-line forming region, by using the mask parts 25cp as mask. In the non-word-line forming region, the control-gate electrode film 16, inter-electrode insulating film 15 and floating-gate electrode film 13 are etched by using the mask parts 25ap, mask parts 25bp, mask pattern 21a and mask pattern 21b as mask. Since etching is carried out in the word-line forming region and the non-word-line forming region at the same time, patterns can be formed more efficiently than otherwise. In this embodiment, etching step of the hard mask patterns 22a and 22b can be omitted, if this material can be etched during the electrode formation. If the hard mask is amorphous silicon, it will be etched during the etching step of the electrode.

Figure 15:
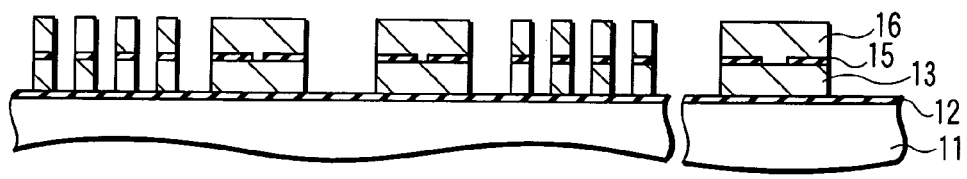

As FIG. 15 depicts, the mask parts 25ap, 25bp and 25cp and the mask patterns 21a and 21b are removed. Memory cell and word-line patterns are thereby formed in the word-line forming region. In the non-word-line forming region, a select transistor pattern, a select-gate line pattern and a peripheral-circuit pattern (e.g., gate pattern for the transistors of a peripheral circuit) are formed. In this embodiment, etching step of the mask parts 25ap, 25bp and 25cp and the mask patterns 21a and 21b can be omitted because these materials are act as an insulator film for the next wiring layer.

Figure 16:
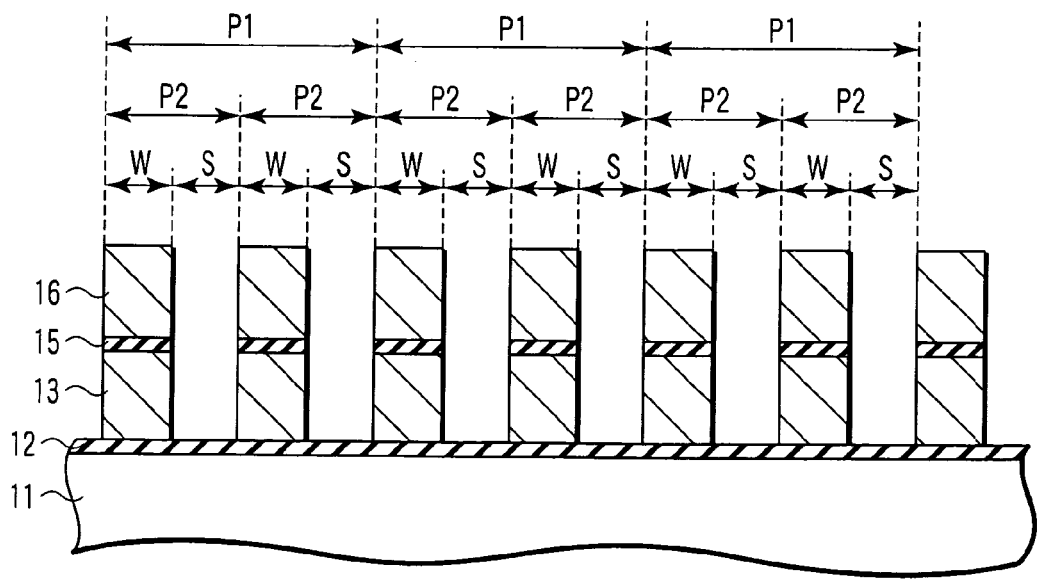
FIG. 16 is a diagram illustrating the arrangement of the line-and-space pattern according to the embodiment of this invention.

FIG. 16 is a diagram illustrating how the patterns thus formed are arranged in the word-line forming region. As seen from FIG. 16, the word lines (i.e., control-gate lines) have the same width W and are spaced apart by the same distance S. The line width W and the space width S may be the same or different from each other. Pitch P2 at which the word lines are arranged is half the pitch P1 of the dummy-line pattern 21c.

In this embodiment, the under-layer region is etched by using, as mask, the patterns formed on the sidewalls of the dummy-line pattern, as described above. It is therefore possible to form a line-and-space pattern having a line pitch shorter than the pitch determined by the resolution limit of photolithography. In addition, other patterns (e.g., select-gate pattern and peripheral-circuit pattern) having widths greater than the width determined by the resolution limit can be formed in the same step as the line-and-space pattern is formed. Hence, desired patterns can be formed reliably and efficiently in the present embodiment.

In this embodiment, the end parts of the mask pattern formed on the sidewall of the dummy-line pattern and shaped like a closed loop are removed. As a result, under-layer patterns shaped like a closed loop are not formed. Desired patterns can therefore be formed, both reliably and efficiently. If wire patterns are formed as the under-layer patterns, they can be reliably isolated from one another. This ensures the normal operation of the device.

In the embodiment described above, the line-and-space pattern pertains to the word lines of a nonvolatile semiconductor memory. Nevertheless, the method according to the embodiment can be applied to line-and-space patterns other than word lines. A method similar to this method can be used to form, for example, such a pattern composed of element regions and isolation trenches, as is shown in FIGS. 2 and 3.

In the embodiment described above, the sidewall pattern (i.e., a pattern composed of the mask parts 25*ap* and 25*bp*) is used as a part of the mask in the non-word-line forming region, too, in the step of FIG. 14 to form the under-layer pattern. However, it is not necessary to use such a sidewall pattern in the non-word-line forming region. It suffices to remove the sidewall pattern from the non-word-line forming region at any appropriate time before the step of FIG. 14 is carried out.

The steps of the method described above can be performed in a different order. For example, the dummy-line pattern 21*c* may be removed after the end parts of the sidewall mask pattern 25*c* are removed, not before the end parts of the sidewall mask pattern 25*c* are removed as described above.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

What is claimed is:

1. A method of manufacturing a semiconductor device, comprising:

forming a first mask pattern on an under-layer region;

forming a plurality of dummy-line patterns on the under-layer region, the dummy-line patterns being arranged at a first pitch;

forming second mask patterns having mask parts provided on long sides of the dummy-line patterns, and a third mask pattern provided on sides of the first mask pattern;

removing the dummy-line patterns; and etching the under-layer region by using the first mask pattern, the third mask pattern, and the mask parts as a mask, wherein the first mask pattern is protected and is not removed in removing the dummy-line patterns.

2. The method according to claim 1, wherein the mask parts are arranged at a second pitch which is half the first pitch.

3. The method according to claim 1, wherein a wiring pattern is formed by etching the under-layer region by using the mask parts as a mask.

4. The method according to claim 3, wherein the wiring pattern is a word-line pattern of a nonvolatile semiconductor memory.

5. The method according to claim 4, wherein a select-gate line pattern of the nonvolatile semiconductor memory is formed by etching the under-layer region by using the first and the third mask patterns as a mask.

6. The method according to claim 4, wherein a peripheral-circuit pattern of the nonvolatile semiconductor memory is formed by etching the under-layer region by using the first and the third mask patterns as a mask.

7. The method according to claim 1, wherein the under-layer region includes a floating gate film, an inter-electrode insulating film provided on the floating gate film, and a control gate film provided on the inter-electrode insulating film.

8. The method according to claim 1, wherein forming the second and the third mask patterns includes:

forming a cover film which covers the first mask pattern and the dummy-line patterns; and etching the cover film by anisotropic etching to form the second and the third mask patterns.

9. The method according to claim 1, wherein forming the dummy-line patterns includes:

forming, on the under-layer region, a provisional pattern having a larger line-width than the dummy-line pattern; and reducing the line-width of the provisional pattern.

10. The method according to claim 1, wherein the first mask pattern is formed by using, as a mask, a protective mask pattern provided on the first mask pattern, and the protective mask pattern protects the first mask pattern in removing the dummy-line patterns.

11. The method according to claim 1, in which the second mask pattern is shaped like a closed loop, surrounding the dummy-line pattern, and which further comprises removing both end parts of the second mask pattern to leave the mask parts.

12. A method of manufacturing a semiconductor device, comprising:

forming a plurality of dummy-line patterns on an under-layer region, the dummy-line patterns being arranged at a first pitch;

forming mask patterns having mask parts provided on long sides of the dummy-line patterns, each of the mask patterns being shaped like a closed loop and surrounding each of the dummy-line patterns;

removing the dummy-line patterns;

removing both end parts of each of the mask patterns to leave the mask parts remaining; and etching the under-layer region by using the remaining mask parts as a mask.

13. The method according to claim 12, wherein the mask parts are arranged at a second pitch which is half the first pitch.

14. The method according to claim 12, wherein a wiring pattern is formed by etching the under-layer region by using the remaining mask parts as a mask.

15. The method according to claim 14, wherein the wiring pattern is a word-line pattern of a nonvolatile semiconductor memory.

16. The method according to claim 12, wherein the under-layer region includes a floating gate film, an inter-electrode insulating film provided on the floating gate film, and a control gate film provided on the inter-electrode insulating film.

17. The method according to claim 12, wherein forming the mask patterns includes:

forming a cover film which covers the dummy-line patterns; and etching the cover film by anisotropic etching to form the mask patterns.

18. The method according to claim 12, wherein forming the dummy-line patterns includes:

forming, on the under-layer region, a provisional pattern having a larger line-width than the dummy-line pattern; and reducing the line-width of the provisional pattern.

19. The method according to claim 12, wherein removing both end parts of the mask pattern is performed by using, as a mask, a resist pattern which covers the mask parts.

* * * * *